United States Patent [19]
Morris et al.

[11] Patent Number: 5,926,056
[45] Date of Patent: Jul. 20, 1999

[54] VOLTAGE TOLERANT OUTPUT BUFFER

[75] Inventors: Bernard Lee Morris, Emmaus; Bijit Thakorbhai Patel, Breinigsville, both of Pa.

[73] Assignee: Lucent Technologies Inc., Murray Hill, N.J.

[21] Appl. No.: 09/005,751

[22] Filed: Jan. 12, 1998

[51] Int. Cl.[6] .................................. H03L 5/00; H03B 1/00
[52] U.S. Cl. ........................... 327/333; 327/112; 326/81; 326/83
[58] Field of Search .................................... 327/108, 109, 327/111, 112, 333, 427, 434, 437, 331, 321; 326/80, 81, 83, 58, 62, 82

[56] References Cited

U.S. PATENT DOCUMENTS

| | | | |
|---|---|---|---|
| 4,704,547 | 11/1987 | Kirsch | 307/443 |
| 5,381,062 | 1/1995 | Morris | 326/68 |
| 5,418,476 | 5/1995 | Strauss | 326/58 |
| 5,512,844 | 4/1996 | Nakakura et al. | 326/81 |
| 5,534,795 | 7/1996 | Wert et al. | 326/81 |
| 5,635,861 | 6/1997 | Chan et al. | 326/81 |
| 5,729,157 | 3/1998 | Monk et al. | 326/80 |
| 5,731,714 | 3/1998 | Monk et al. | 326/83 |
| 5,864,243 | 1/1999 | Chen et al. | 326/81 |

*Primary Examiner*—Toan Tran
*Attorney, Agent, or Firm*—James H. Fox

[57] ABSTRACT

An integrated circuit output buffer has an improved tolerance to voltage levels that are greater than the power supply voltage level at which the IC is designed to operate. A first transmission gate transistor (110), typically p-channel, is connected between an output conductor (101) and a resistor (108) at a given node (114). The node is also connected to the gate of a second transmission gate transistor (105), typically also p-channel. The resistor pulls the given node towards a power supply voltage level (e.g., ground), so that the second transmission gate transistor conducts in normal operation. To prevent the node from reaching ground, at least one diode-like voltage-dropping device (201, 202) is connected in series with the resistor.

7 Claims, 2 Drawing Sheets

VOLTAGE TOLERANT OUTPUT BUFFER

BACKGROUND OF THE INVENTION

1. Field of the Invention

An integrated circuit includes a voltage-tolerant output buffer.

2. Description of Prior Art

In the operation of integrated circuits, and integrated circuit (IC) that is fabricated for use with a given power supply voltage must often interface with other ICs that operate at a higher voltage. For example, an IC fabricated in a 3.3 technology must often operate with 5 volt signals supplied to its input/output bondpads from other devices. This may create reliability problems, since the maximum source-to-drain voltage, and gate oxide voltage for MOS transistors formed on the IC are typically not intended to withstand the higher voltage levels. A well-known prior-art circuit that allows an output buffer made in a 3.3 volt technology to tolerate a 5 volt signal on its output bondpad is shown in FIG. 1. A digital data signal "A" from circuitry on the IC is applied to the buffer input node 118. The buffer is placed in either the "tri-state" (i.e., high output impedance) or the normal mode of operation by an enable signal "EN" on node 117. When EN is low, the inverter 115 and NOR gate 116 place a low voltage on the gate of n-channel transistor 112, turning it off. Similarly, the NAND gate 102 places a high voltage on the gate of the p-channel transistor 103, turning it off. This allows the bondpad 101 to function as an input bondpad for input circuitry (not shown) on the same IC as the output buffer. When EN is high, the gates 102 and 116 are allowed to transmit data signals from node 118 to the transistors 103 and 112 to provide for the "normal" mode of operation.

In the normal mode of operation, with no external voltage applied to the bondpad 101, the circuit 100 operates as follows: The output of the NAND gate 102 is applied to the gate of transistor 103 through a transmission-gate made of transistors 104 and 105. Transistor 104 has its gate connected to $V_{DD}$; thus transistor 104 is always on. However, it cannot transmit a voltage higher than $V_{DD}-V_{tn}$ from node 106 to node 107. Therefore a p-channel transistor 105 is added in parallel to ensure that node 107 can pull all the way up to $V_{DD}$, and thus turn the buffer pull-up transistor 103 off. In normal operation, the gate of 105 is held at ground, turning it on. The device 108 shown in FIG. 1 is a resistor; however a transistor or group of transistors might be used in its place. For example, the use of one or more serially-connected n-channel transistors having their gates connected to $V_{DD}$ may be used as the resistor 108. Transistors 109 and 110 have their gates connected to $V_{DD}$, and so are usually off in operation, except as discussed below. The protective transistor 111 also has its gate connected to $V_{DD}$. The purpose of this device is to protect the buffer pull-down transistor 112 against a high voltage on the bondpad 101, since protective transistor 111 prevents node 113 from ever rising above $V_{DD}-V_{tn}$, where $V_{tn}$ is the threshold voltage of n-channel MOS transistors on the IC.

When a high voltage is applied to the bondpad 101 of the tri-stated buffer, transistors 109 and 110 will turn on at a voltage equal to $V_{DD}+V_{tp}$, where $V_{tp}$ is the threshold voltage of p-channel MOS transistors on the IC. When this occurs, the bondpad voltage will be applied to node 107 through transistor 109, and to node 114 through transistor 110. If the on resistance of transistor 110 is much less that that of resistor 108, the voltage on the gate of transistor 105 will turn that transistor off. This is desirable to ensure that the bondpad voltage which is applied to node 107 does not "shoot-through" transistor 105 and be applied to the NAND gate 102, which could damage it.

SUMMARY OF THE INVENTION

We have invented an integrated circuit output buffer having an improved tolerance to voltage levels that are greater than the power supply voltage level at which the IC is designed to operate. A first transmission gate transistor, typically p-channel, is connected between an output conductor and a resistor at a given node. The node is also connected to the gate of a second transmission gate transistor, typically also p-channel. The resistor pulls the given node towards a power supply voltage level (e.g., ground), so that the second transmission gate transistor conducts in normal operation. To prevent the node from reaching ground, at least one diode-like voltage-dropping device is included in series with the resistor.

DETAILED DESCRIPTION OF THE INVENTION

Figure 1:
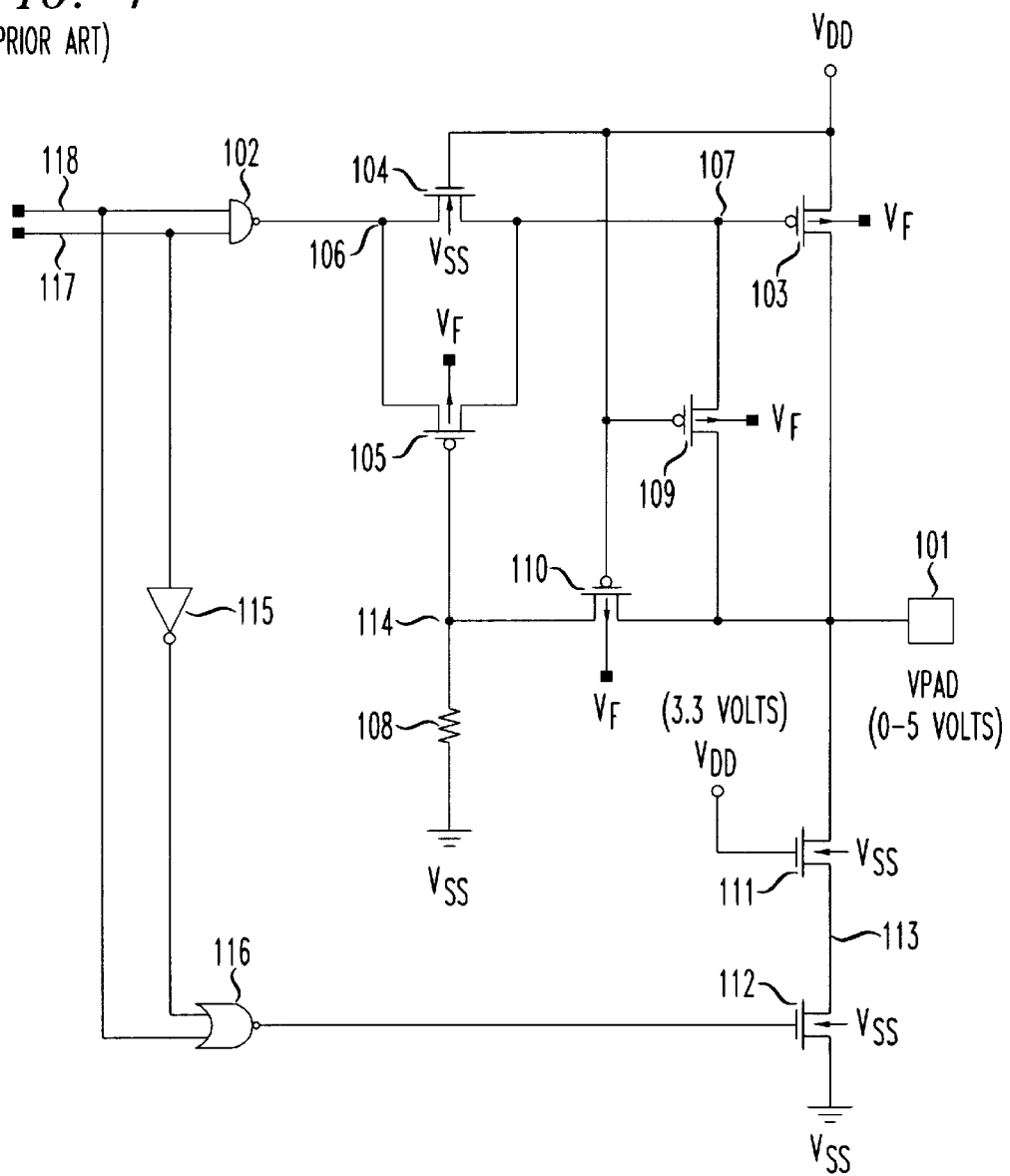
FIG. 1 shows a prior-art voltage-tolerant output buffer.

The following detailed description relates to an improved voltage-tolerant output buffer. This invention results from a recognition that the circuit currently used for 5 volt tolerant output buffers (FIG. 1) can have a bias across the drain-to-source of transistor 110 as high as 4.8 volts in the illustrative case. This bias can have deleterious effects on the reliability of transistor 110 over time. The problem results from the fact that normal range of $V_{DD}$ is 3.3V±10%, so that $V_{DD}$ can be as high as 3.6V. This means that transistor 109 and 110, which will not turn on until the bondpad voltage reaches $V_{DD}+V_{tp}$, may not be on until the bondpad is as high as 4.8 volts. This high voltage is never applied across the gate oxide of transistors 109 and 110, or across the source-to-drain (VDS) of transistor 109, since node 107 is at a high value in when the buffer is in the tri-state (high output impedance) condition. However since the value of node 114 is zero until transistor 110 turns on, the VDS of transistor 110 will be equal to the bondpad voltage until that voltage equals $V_{DD}+V_{tp}$, which can be as high as 4.8 volts if VDD=3.6 volts. In contrast, the inventive circuitry allows an output buffer made in a 3.3V technology to tolerate a 5 volt signal without ever exceeding 3.6 volts across the gate or source-to-drain of any transistor in the circuit.

Figure 2:
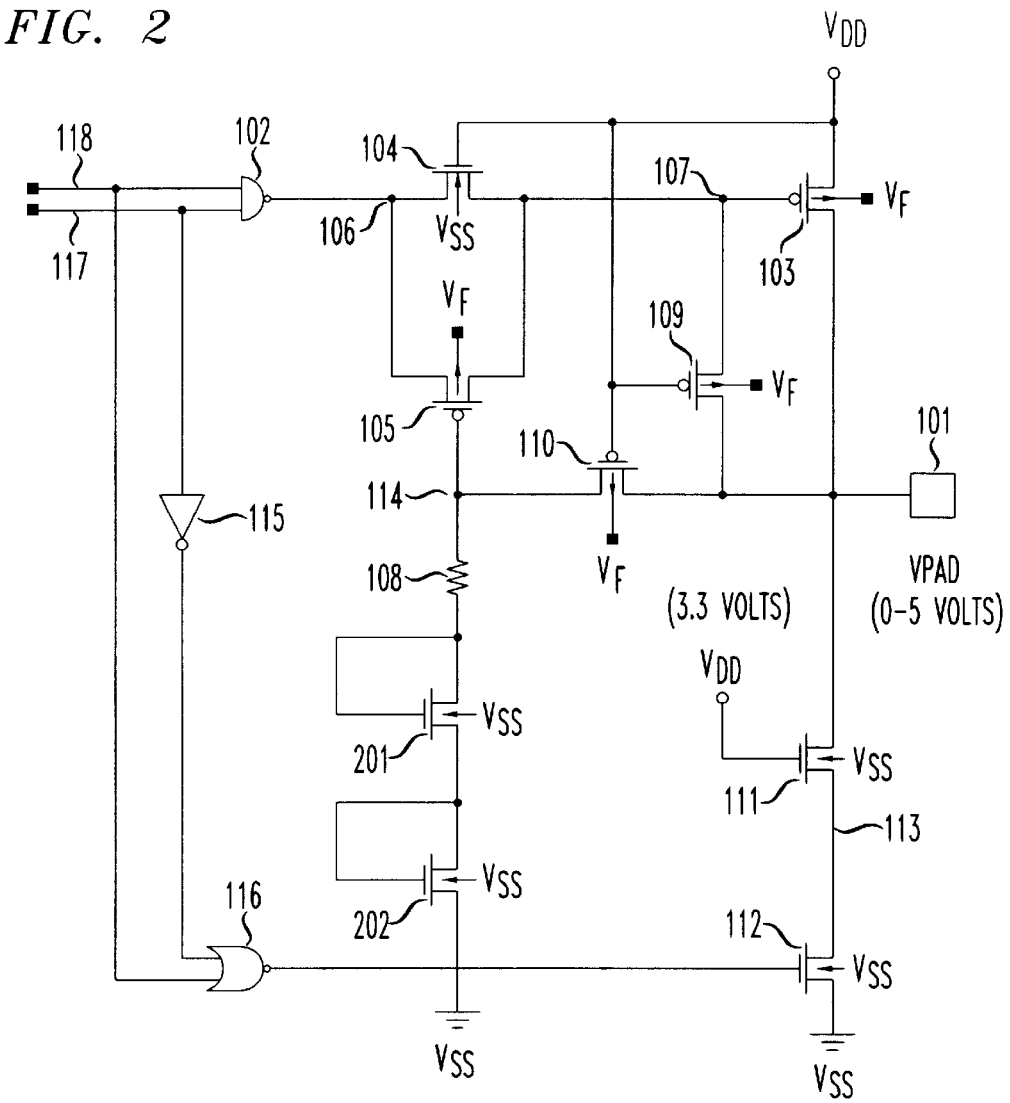
FIG. 2 shows an improved voltage-tolerant output buffer that embodies the invention.

A circuit 200 that accomplishes this is shown in FIG. 2. The numbering of components is retained from FIG. 1. However, in this circuit, two additional transistors, 201 and 202, are added. These are connected as diodes; i.e., their gates are connected to their drains. In normal operation, node 114 will be close to, but not exactly at, ground potential. The exact value depends on the small but ever-present leakage currents that will flow through transistors 201 and 202, and bring node 114 to a voltage of typically 0.5 volts. This is still low enough to turn on transistor 105. If a high voltage is now applied to the bondpad 101, subthreshold leakage through transistor 110 will quickly bring up node 114 to a voltage of approximately 1 volt. The higher the bondpad voltage the higher the voltage on node 114. Computer simulations (using the ADVICE model) to determine the voltage on node 114, and the source-to-drain voltage across transistor 110, have been conducted while a voltage of up to 5.5 volts is applied to the bondpad 101. These simulations show that in the prior-art circuit of FIG. 1, node 114 does not increase from zero until the bondpad voltage, $V_{PAD}$, reaches 4.8 volts, while node 114 of the new circuit of FIG. 2, starts to slowly increase as soon as the bondpad voltage rises above $V_{DD}$, and increases even more strongly when the bondpad voltage exceeds 4.5 volts. The peak of VDS across transistor 110 is 4.8 volts for the prior-art circuit of FIG. 1, but only 3.5 volts for the new circuit of FIG. 2. Hence, degradation of transistor 110 is substantially reduced, and the level of reliability of the integrated circuit is substantially increased.

Figure 3:
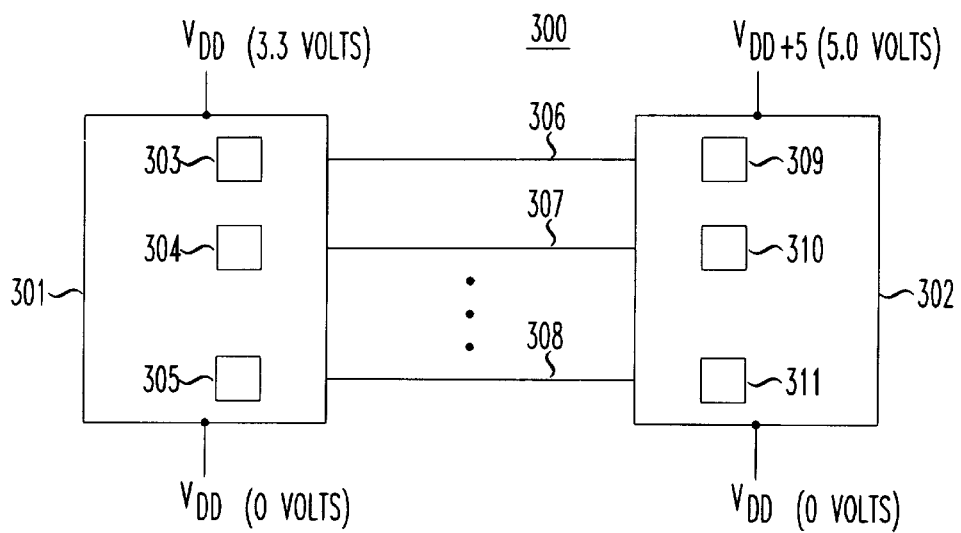
FIG. 3 shows a system using integrated circuits having different power supply voltages.

A typical system 300 utilizing integrated circuits 301 and 302 that operate at different power supply voltages is shown in FIG. 3. The output buffers 303, 304 and 305 on the IC 301 operate at 3.3 volts, and utilize the inventive technique. This allows them to withstand signals that range from 0 to 5 volts that are placed on the bus conductors 306, 307 and 308 by the buffers 309, 310 and 311 on IC 302, which operates at 5 volts. Still other ICs may communicate with the bus, as is known in the art.

Figure 4:
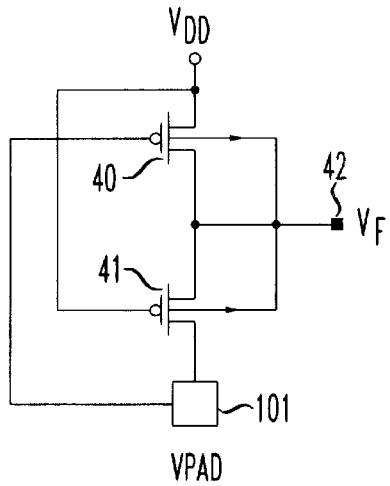
FIG. 4 shows a circuit useful for generating a back-gate bias voltage.

In the operation of the circuitry shown in FIGS. 1 and 2, it is useful to bias the n-tub regions (also referred to as "n-walls" in the art) in which the p-channel transistors are formed so that the p-type source and drain regions do not become forward-biased with respect to the n-tub. Therefore, a back-gate bias voltage $V_F$ is applied to the p-channel transistors. This voltage $V_F$ may be generated by a variety of techniques, with one known circuit technique being shown in FIG. 4. This circuitry provides that $V_F$ is equal to $V_{DD}$ when the voltage VPAD on the bondpad 101 is low. That is, when VPAD is at least one threshold voltage drop below $V_{DD}$, transistor 40 conducts. The circuitry further provides that $V_F$ is equal to VPAD when VPAD is greater than one threshold voltage drop greater than $V_{DD}$, so that transistor 41 conducts. Therefore, $V_F$ rises to the level of a 5 volt signal, for example, when a 5 volt signal is present on the bondpad 101. In this manner, a forward-bias condition is avoided while still preventing the p-channel transistors from being subjected to excessive voltages.

In summary, the present invention allows a tri-statable digital CMOS output buffer made in a low voltage technology to interface with an external bus and tolerate high voltage signals without risking a degradation of transistor characteristics. While the above embodiment has been discussed in terms of a 3.3 volt nominal power supply voltage, it will be apparent that the inventive technique applies to lower power supply voltages as well. For example, integrated circuits designed to operate with the upcoming 2.5 volt power supply standard may use the inventive technique when interfacing with 3.3 volt signals from external sources. Applicability to still lower power supply voltages is possible and included herein. The diode-like voltage dropping devices used herein may be implemented with a variety of devices. For example, an n-channel transistor is noted above, but alternatively a diode-connected p-channel transistor may be used, or alternatively a junction diode. In general, the diode-like voltage-dropping device provides a fixed voltage drop of typically at least 0.5 volts at relatively low current (e.g., less than 10 nanoamps), which voltage drop typically increases relatively slowly at higher currents, and also typically provides a leakage current through the device. This device may be modeled as an ideal diode in series with a resistor, and having another resistor in parallel.

What is claimed:

1. An integrated circuit having an output buffer comprising a pull-up transistor (103) and a pull-down transistor (112) coupled to an output (101), a transmission gate comprising a p-channel transistor (105) coupled to the gate of said pull-up transistor (103), and a p-channel transistor (109) coupled between said output (101) and the control electrode of said pull-up transistor (103), and having a gate coupled to receive a positive power supply voltage ($V_{DD}$);

and further comprising a p-channel transistor (110) coupled between said output (101) and a given node (114) that connects the gate of said p-channel transistor (105) in said transmission gate to a resistor (108) coupled to receive a reference power supply voltage ($V_{SS}$);

characterized in that said output buffer still further comprises at least one diode-like voltage-dropping device (201) connected in series with said resistor (108).

2. The invention of claim 1 wherein said output buffer further comprises at least one additional voltage-dropping device (202) connected in series with said resistor.

3. The invention of claim 1 wherein said at least one voltage-dropping device is an n-channel field effect transistor having its gate connected to its drain.

4. The invention of claim 1 wherein said resistor is at least one n-channel field effect transistor having its gate connected to receive said positive power supply voltage ($V_{DD}$).

5. A system comprising a first integrated circuit (301) and a second integrated circuit (302) that communicate over bus conductors (306, 307, 308), with said first integrated circuit having an output buffer comprising a pull-up transistor (103) and a pull-down transistor (112) coupled to an output (101), a transmission gate comprising a p-channel transistor (105) coupled to the gate of said pull-up transistor (103), and a p-channel transistor (109) coupled between said output (101) and the control electrode of said pull-up transistor (103), and having a gate coupled to receive a positive power supply voltage ($V_{DD}$);

and further comprising a p-channel transistor (110) coupled between said output (101) and a given node (114) that connects the gate of said p-channel transistor (105) in said transmission gate to a resistor (108) coupled to receive a reference power supply voltage ($V_{SS}$);

characterized in that said output buffer still further comprises at least one diode-like voltage-dropping device (201) connected in series with said resistor (108).

6. The invention of claim 5 wherein said output buffer further comprises at least one additional diode-like voltage-dropping device (202) connected in series with said resistor.

7. The invention of claim 5 wherein said at least one diode-like voltage-dropping device is an n-channel field effect transistor having its gate connected to its drain.

* * * * *